(12) United States Patent
Chen

(10) Patent No.: US 10,895,594 B2
(45) Date of Patent: Jan. 19, 2021

(54) ELECTRICAL CONNECTOR ASSEMBLY HAVING FAN SUPPORT THEREON

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Ming-Yue Chen, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 150 days.

(21) Appl. No.: 16/167,495

(22) Filed: Oct. 22, 2018

(65) Prior Publication Data
US 2019/0120896 A1 Apr. 25, 2019

(30) Foreign Application Priority Data
Oct. 20, 2017 (TW) .............................. 106136013 A

(51) Int. Cl.
*G01R 31/28* (2006.01)
*F28D 15/02* (2006.01)
(Continued)

(52) U.S. Cl.
CPC ..... *G01R 31/2863* (2013.01); *F28D 15/0275* (2013.01); *G01R 1/0433* (2013.01);
(Continued)

(58) Field of Classification Search
CPC .......................... G01R 31/2863; G01R 1/0458; G01R 1/0433; H05K 3/00; H01R 13/24;
(Continued)

(56) References Cited

U.S. PATENT DOCUMENTS 6,086,387 A * 7/2000 Gallagher ............ G01R 1/0483
439/331
6,181,556 B1 * 1/2001 Allman ..................... G06F 1/20
165/185

(Continued)

FOREIGN PATENT DOCUMENTS

TW 351492 U * 2/2009

OTHER PUBLICATIONS

Lin, Wei-Chih, "Electrical connector", Feb. 21, 2009, Hon Hai Prec Ind Co Ltd., Entire Document (Translation of TW 351492). (Year: 2009).*

*Primary Examiner* — Stephen S Sul
(74) *Attorney, Agent, or Firm* — Wei Te Chung; Ming Chieh Chang

(57) ABSTRACT

An electrical connector assembly includes an insulative housing, a first cover pivotally assembled to the housing, a second cover pivotally assembled to the first cover, and a fan support secured upon the second cover. A plurality of contacts are disposed in the housing. A heat sink is associated with the second cover. A pair of fans are located by two opposite lateral sides of the heat sink and fixed to the fan support so as to induce an air flow along the slots defined between fins of the heat sink in a transverse direction.

19 Claims, 11 Drawing Sheets

(51) Int. Cl.
*G01R 1/04* (2006.01)
*H01L 23/367* (2006.01)
*H01L 23/427* (2006.01)
*H01L 23/467* (2006.01)
*H01R 13/24* (2006.01)
*H05K 3/00* (2006.01)
*H01R 12/71* (2011.01)
*H01L 21/48* (2006.01)

(52) U.S. Cl.
CPC ........ *G01R 1/0458* (2013.01); *H01L 23/3672* (2013.01); *H01L 23/427* (2013.01); *H01L 23/467* (2013.01); *H01R 13/24* (2013.01); *H05K 3/00* (2013.01); *H01L 21/4882* (2013.01); *H01R 12/716* (2013.01)

(58) Field of Classification Search
CPC . H01R 12/716; H01L 23/3672; H01L 23/467; H01L 23/427; H01L 21/4882; F28D 15/02; F28D 15/0275
USPC ....... 361/688, 695, 697, 704, 707, 709, 718, 361/719
See application file for complete search history.

(56) References Cited

U.S. PATENT DOCUMENTS

| | | | | |
|---|---|---|---|---|
| 6,343,013 | B1* | 1/2002 | Chen | H01L 23/4093 165/185 |
| 6,466,443 | B1* | 10/2002 | Chen | H01L 23/4093 165/122 |
| 6,648,664 | B1* | 11/2003 | McHugh | H01L 23/4093 257/E23.086 |
| 7,414,841 | B2* | 8/2008 | Chen | G06F 1/20 165/104.33 |
| 2002/0075024 | A1* | 6/2002 | Fredeman | G01R 1/0458 324/750.05 |
| 2003/0058621 | A1* | 3/2003 | Wells | H01L 23/4093 361/719 |
| 2003/0227749 | A1* | 12/2003 | Li | H01L 23/467 361/697 |
| 2005/0111191 | A1* | 5/2005 | Lee | H01L 23/4093 361/704 |
| 2005/0195573 | A1* | 9/2005 | Huang | H01L 23/4093 361/709 |
| 2005/0206368 | A1* | 9/2005 | Lopez | G01R 1/0458 324/750.07 |
| 2007/0238327 | A1* | 10/2007 | Hsu | G01R 1/0458 439/70 |
| 2007/0281506 | A1* | 12/2007 | Wang | H01R 12/714 439/70 |
| 2008/0062653 | A1* | 3/2008 | Li | H01L 23/4093 361/719 |
| 2008/0305670 | A1* | 12/2008 | Gattuso | H01L 23/4093 439/342 |
| 2009/0104807 | A1* | 4/2009 | Lin | G01R 1/0466 439/341 |
| 2009/0291582 | A1* | 11/2009 | Lin | G01R 1/0466 439/331 |
| 2010/0101757 | A1* | 4/2010 | Xu | H01L 23/467 165/80.3 |
| 2011/0039425 | A1* | 2/2011 | Hsu | H01R 13/2435 439/73 |
| 2011/0097921 | A1* | 4/2011 | Hsu | H05K 7/10 439/331 |
| 2012/0252243 | A1* | 10/2012 | Chan | G01R 1/0458 439/197 |
| 2014/0375345 | A1* | 12/2014 | Lin | G01R 31/2863 324/750.05 |

* cited by examiner

ELECTRICAL CONNECTOR ASSEMBLY HAVING FAN SUPPORT THEREON

BACKGROUND OF THE DISCLOSURE

1. Field of the Disclosure

The present disclosure relates to a burn-in socket for testing a CPU (Central Processing Unit), and particularly to the burn-in socket equipped with a fan support for cooperating with a heat sink attached thereto.

2. Description of Related Arts

The traditional burn-in socket is equipped with a fan fastened upon the heat sink which is intimately positioned upon the CPU received within the burn-in socket. The air blows downwardly toward the heat sink through the fan and is expelled from the heat sink transversely along the slots between the fins. Anyhow, the heat transfer efficiency is not sufficient for the high power CPU in such an arrangement.

An improved heat transfer arrangement is desired.

SUMMARY OF THE DISCLOSURE

Accordingly, an object of the present disclosure is to provide an electrical connector assembly with an improved heat transfer efficiency for the high power CPU received within the burn-in socket during testing.

An electrical connector assembly includes an insulative housing, a first cover pivotally assembled to the housing, a second cover pivotally assembled to the first cover, and a fan support secured upon the second cover. A plurality of contacts are disposed in the housing. A heat sink is associated with the second cover. A pair of fans are located by two opposite lateral sides of the heat sink and fixed to the fan support so as to induce an air flow along the slots defined between fins of the heat sink in a transverse direction.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
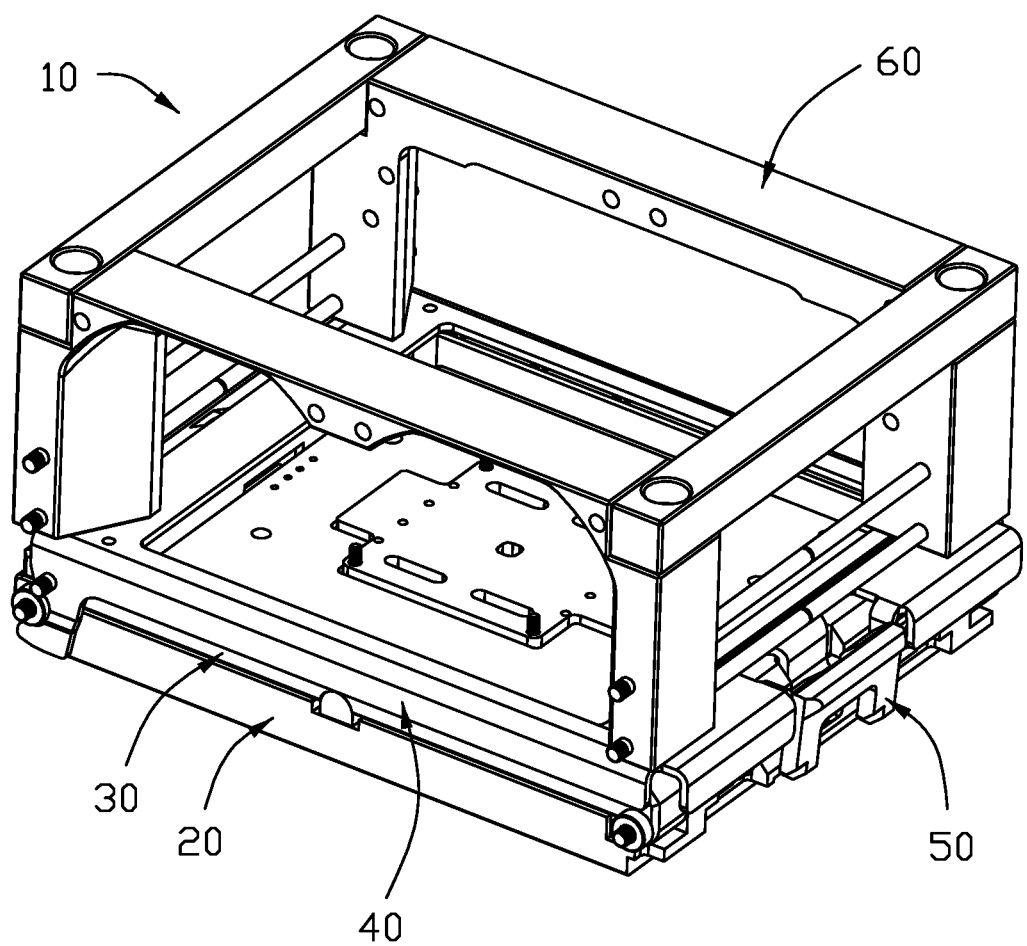
FIG. 1 is a perspective view of the electrical connector assembly without showing the heat sink and fans, according to the invention.
Figure 2:
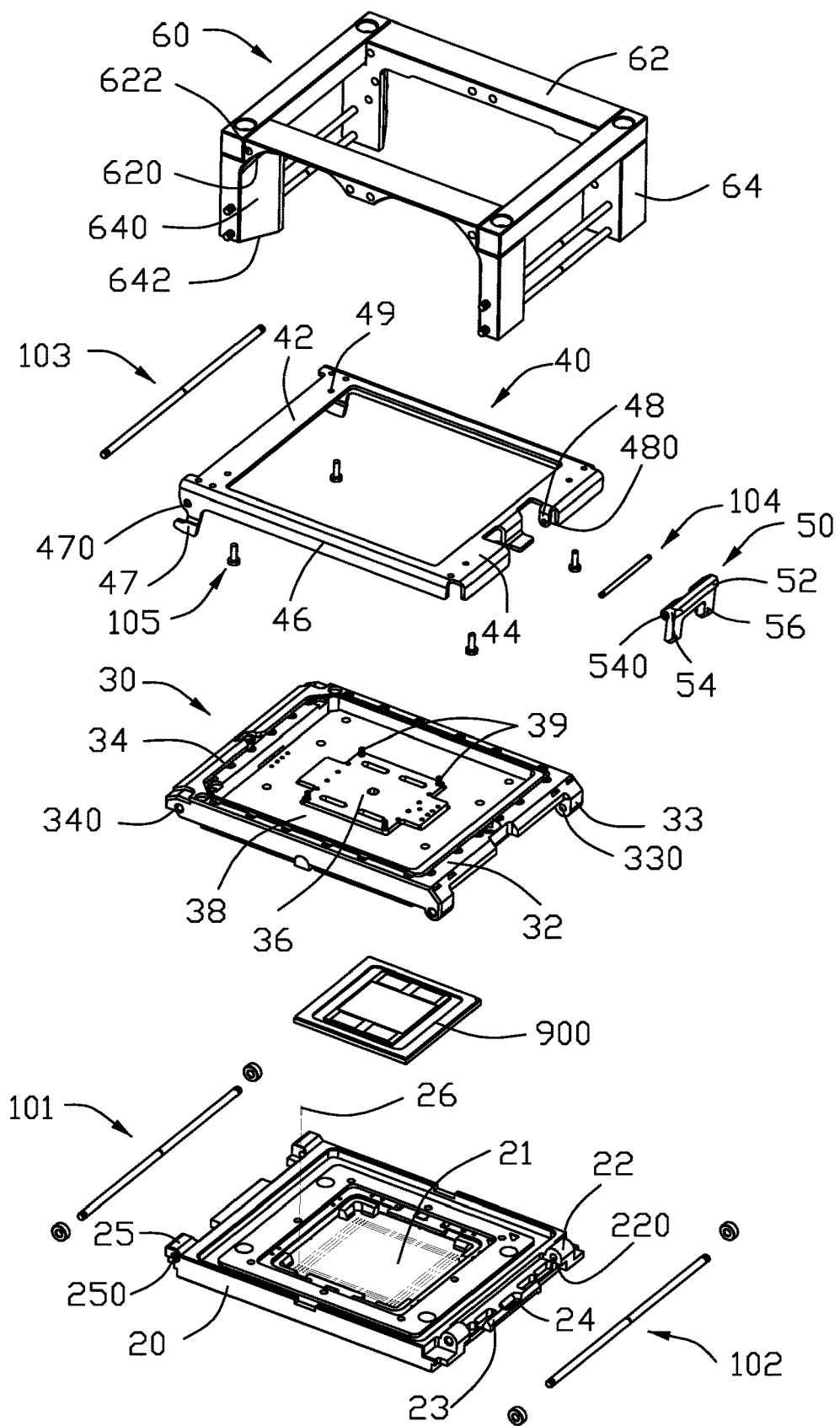
FIG. 2 is an exploded perspective view of the electrical connector assembly of FIG. 1.
Figure 3:
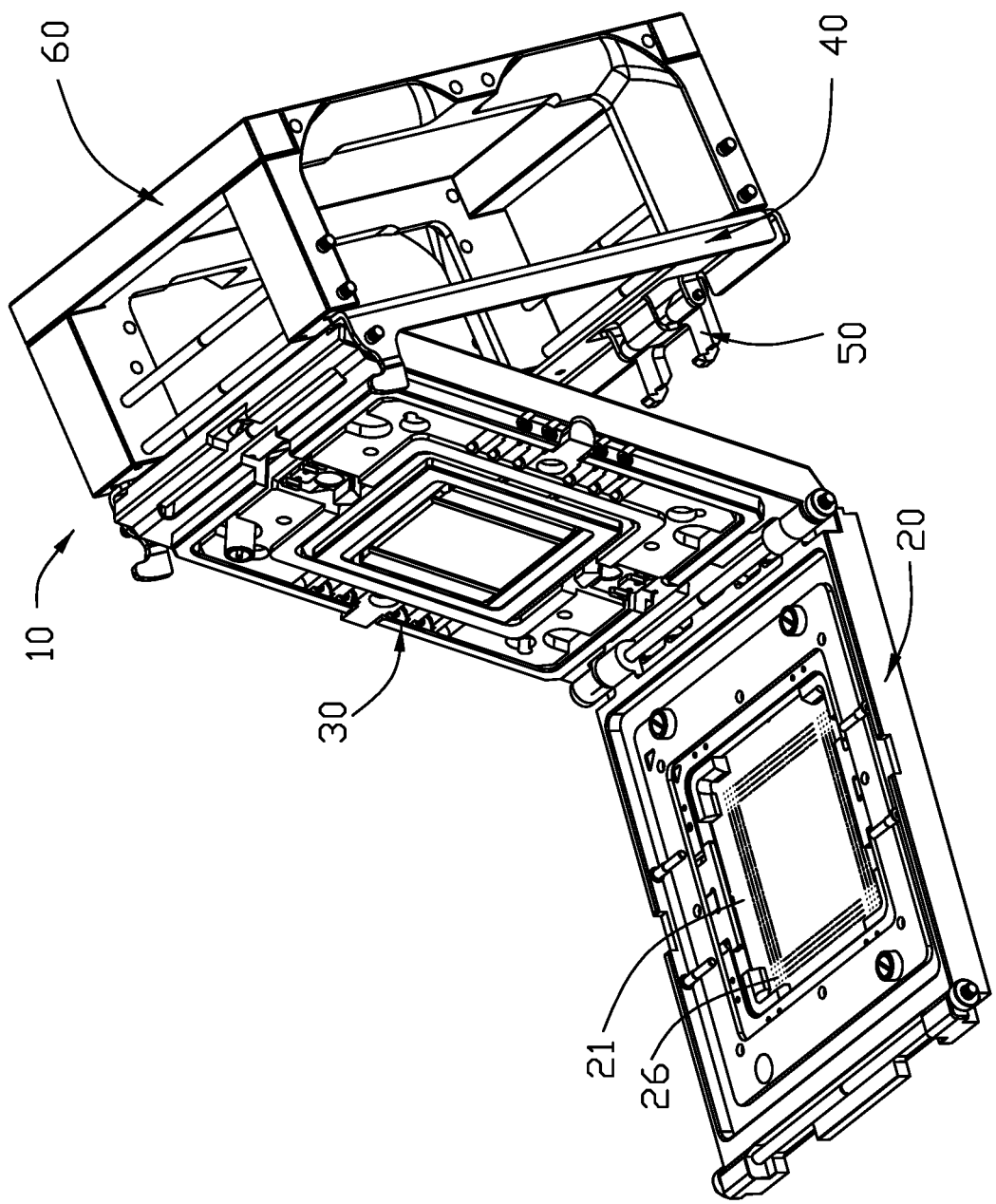
FIG. 3 is an assembled perspective view of the electrical connector assembly of FIG. 1.

Reference description will now be made in detail to the embodiment of the present disclosure.

Referring to FIGS. 1-10, an electrical connector assembly 10 for connecting a CPU 900 to a printed circuit board (not shown), includes an insulative housing or housing unit 20 and a plurality of contacts 26 retained in the housing 20, a first cover 30 pivotally assembled to the housing 20 for receiving an electronic package or the CPU 900 therein, a second cover 40 pivotally assembled to the first cover 30, a locker 50 pivotally assembled to the second cover 40, and a fan support 60 fixed to the second cover 40.

The housing 20 is rectangular and defines a receiving cavity 21 therein to receive the corresponding CPU 900. One end/side of the housing 20 includes a pair of pivot blocks 22 with corresponding pivot holes 220 therein. The crossbar 102 extends through the pivot holes 220. A protrusion 23 is located between the pair of blocks 22, and a locking section 24 is formed on an underside of the protrusion 23. In this embodiment, the locking section 24 is a recess. The other end/side of the housing 20 forms another pair of pivot blocks 25 with corresponding pivot holes 250 therein. The crossbar 101 extends through the pivot holes 250.

The first cover 30 is of a frame structure having a pivot side/end 32 for assembling to the housing 20 via the crossbar 102, and a locking side/end 34 opposite to the pivot side 32 in a front-to-back direction. A receiving space 38 is formed in the first cover for receiving a base of a heat sink 70. A bearing section 36 is located in a center region and intimately connected to a bottom face of the base of the heat sink 70 via the four screws 39. The heat sink 70 further is secured to the first cover via four springs 75 in a tensioned manner traditionally. Understandably, the heat sink 70 includes a plurality of fins 74 spaced with one another in a transverse direction perpendicular to the front-to-back direction, and three heat pipes 72 extend through the fins in the transverse direction for enhancing heat transfer. The pivot side 32 includes a pair of ears 33 with corresponding pivot holes 330 so as to receive the crossbar 102. The locking side 34 forms a pivot hole 340.

The second cover 40 is metal and essentially covers the first cover 30. The second cover 40 includes a pivot side/end 42, and a locking side/end 44 opposite to the pivot side 42, and a pair of linking sides 46 between the pivot side 42 and the locking side 44. The pivot side 42 forms a pair of legs 47 with corresponding pivot holes 470. The crossbar 103 extends through the pivot holes 340 of the first cover 30 and the pivot holes 470 of the second cover 40 to assemble the first cover 30 and the second cover 40 together in a pivotal manner. The locking side 44 forms a pair of ears 48 with corresponding pivot holes 480. A plurality of holes 49 are formed on four corners of the second cover 40

The locker 50 includes a pressing section 52 and a body 54 with a hook 56 at the bottom. A pivot hole 540 is formed in the body 54. A pin 104 extends through the pivot hole 540 of the locker 50 and the pivot hole 480 of the second cover 40 to assemble the locker 50 on the second cover 40. The hook 56 is engaged with the locking section 24 of the housing 20 so as to have the whole connector assembly in a locking state.

Figure 4:
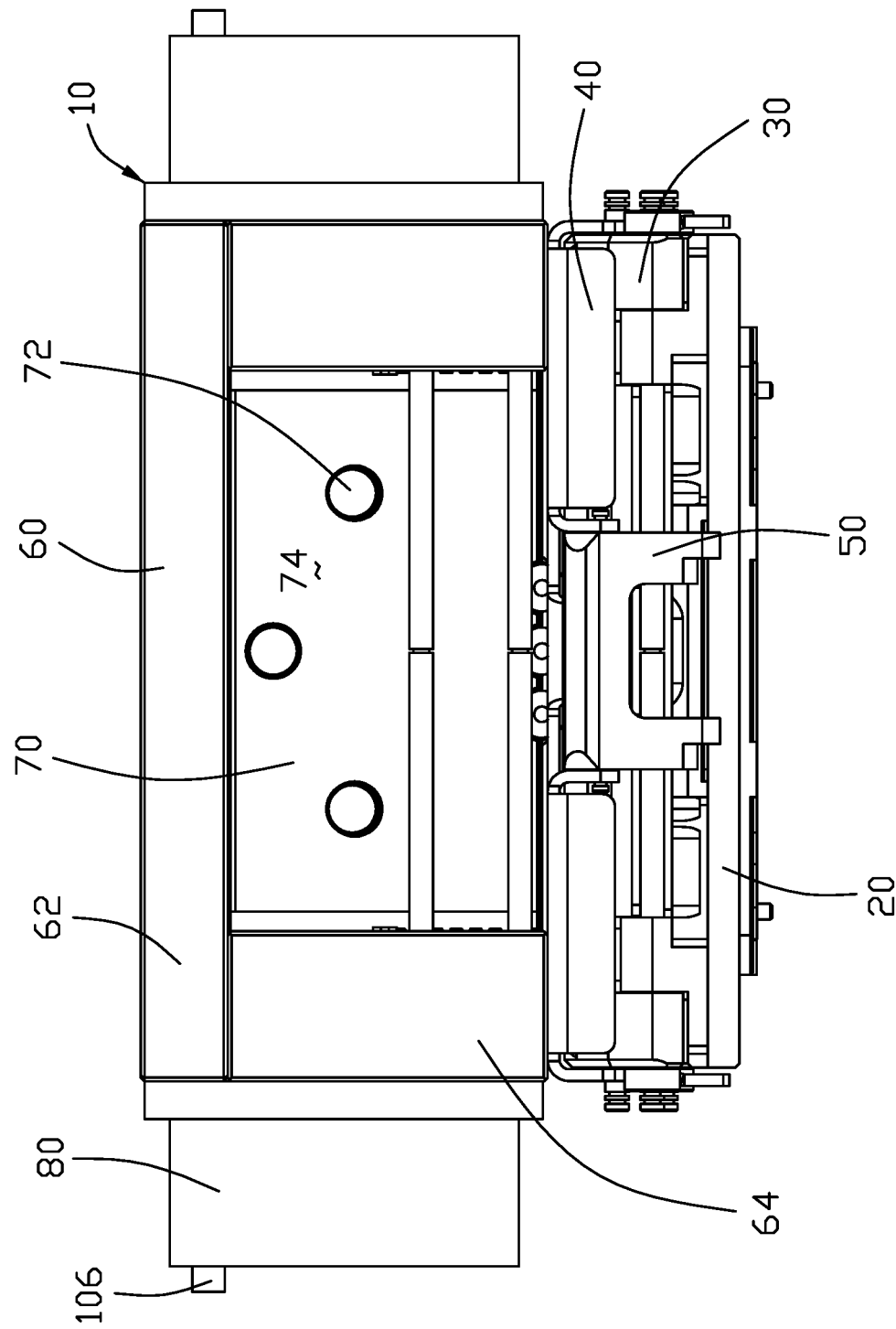
FIG. 4 is an elevational view of the electrical connector assembly of FIG. 1.
Figure 5:
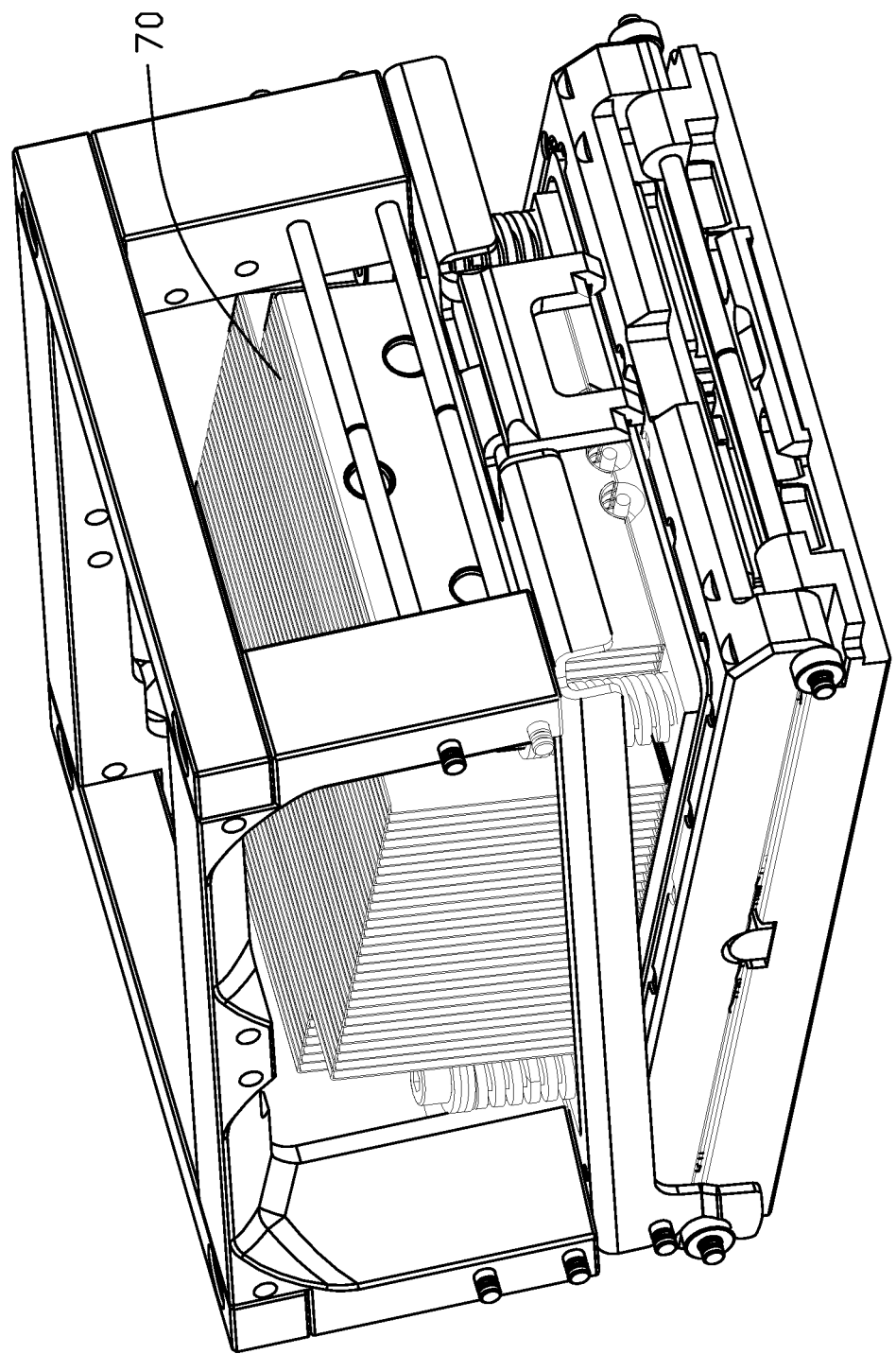
FIG. 5 is an assembled perspective view of the electrical connector assembly of FIG. 1 showing the heat sink wherein the second cover is ready to be closed.
Figure 6:
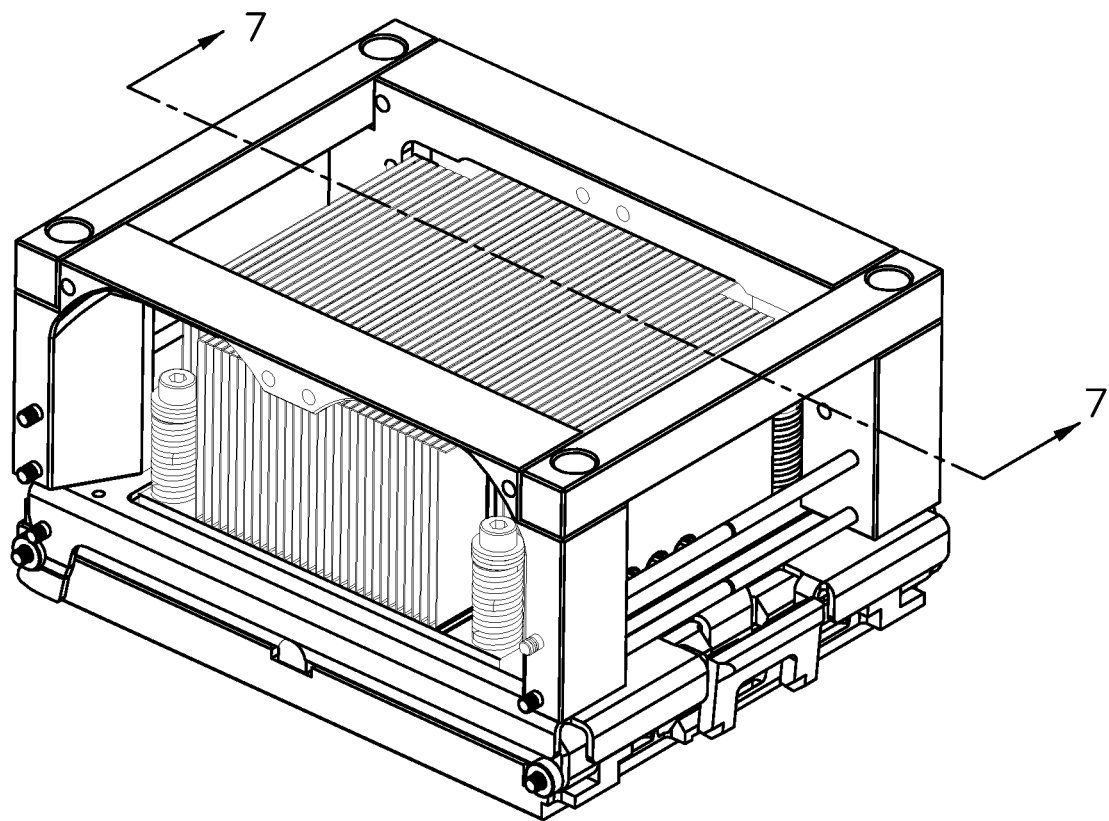
FIG. 6 is an assembled perspective view of the electrical connector assembly of FIG. 5 in a closed manner.
Figure 7:
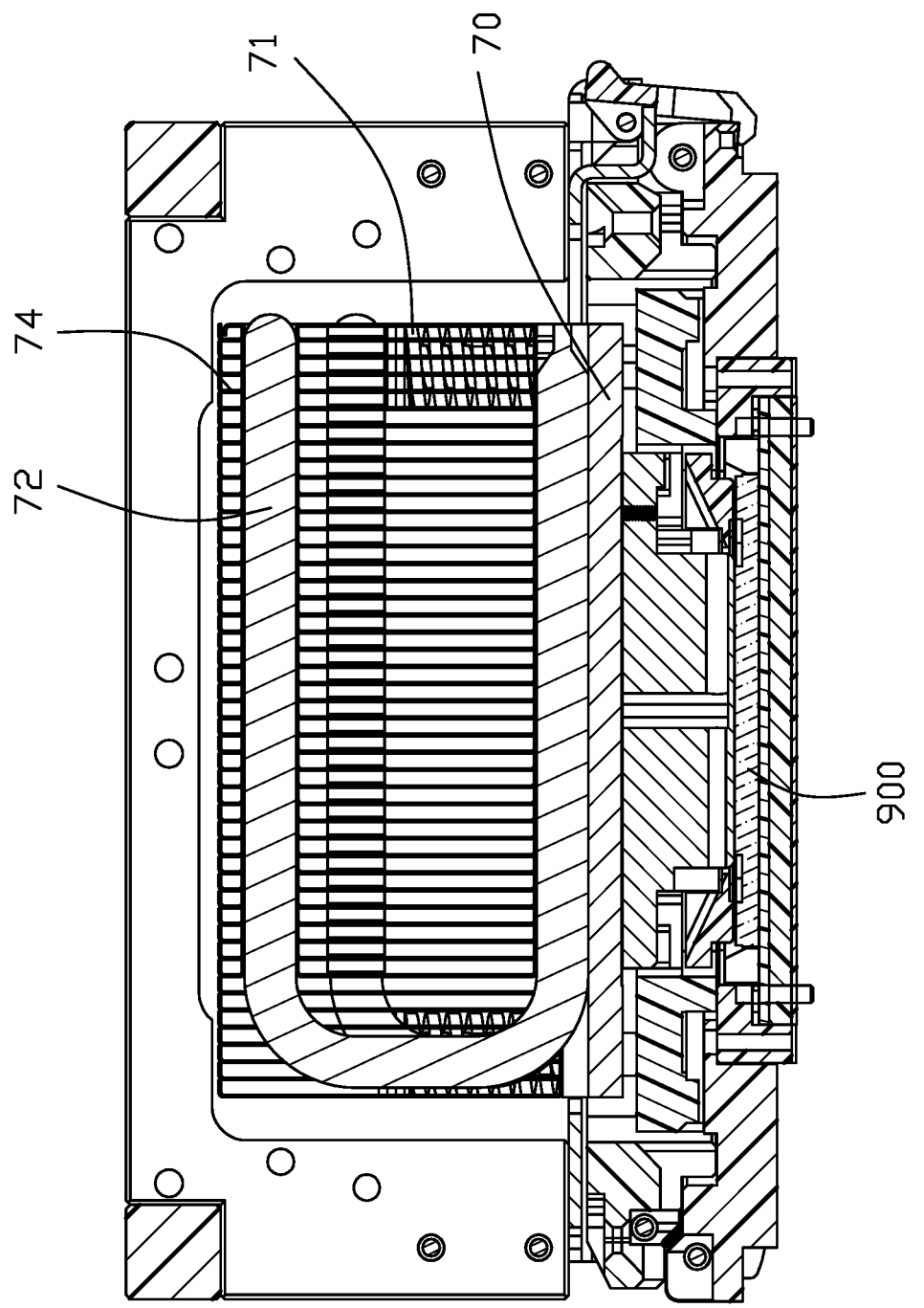
FIG. 7 is a cross-sectional view of the electrical connector assembly of FIG. 6.
Figure 8:
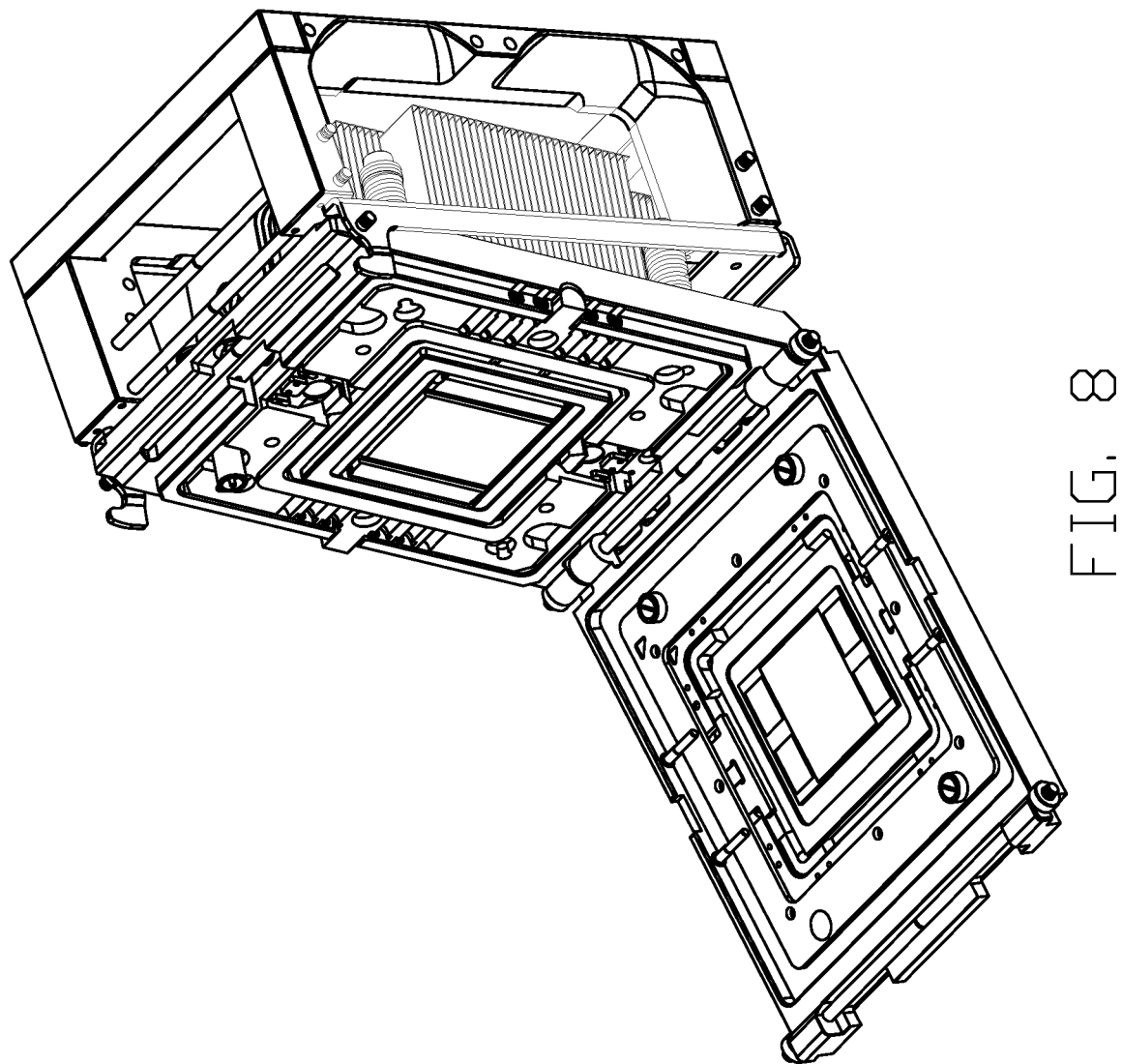
FIG. 8 is an assembled perspective view of the electrical connector assembly of FIG. 1 wherein both the first cover and the second cover are not fixed.
Figure 9A:
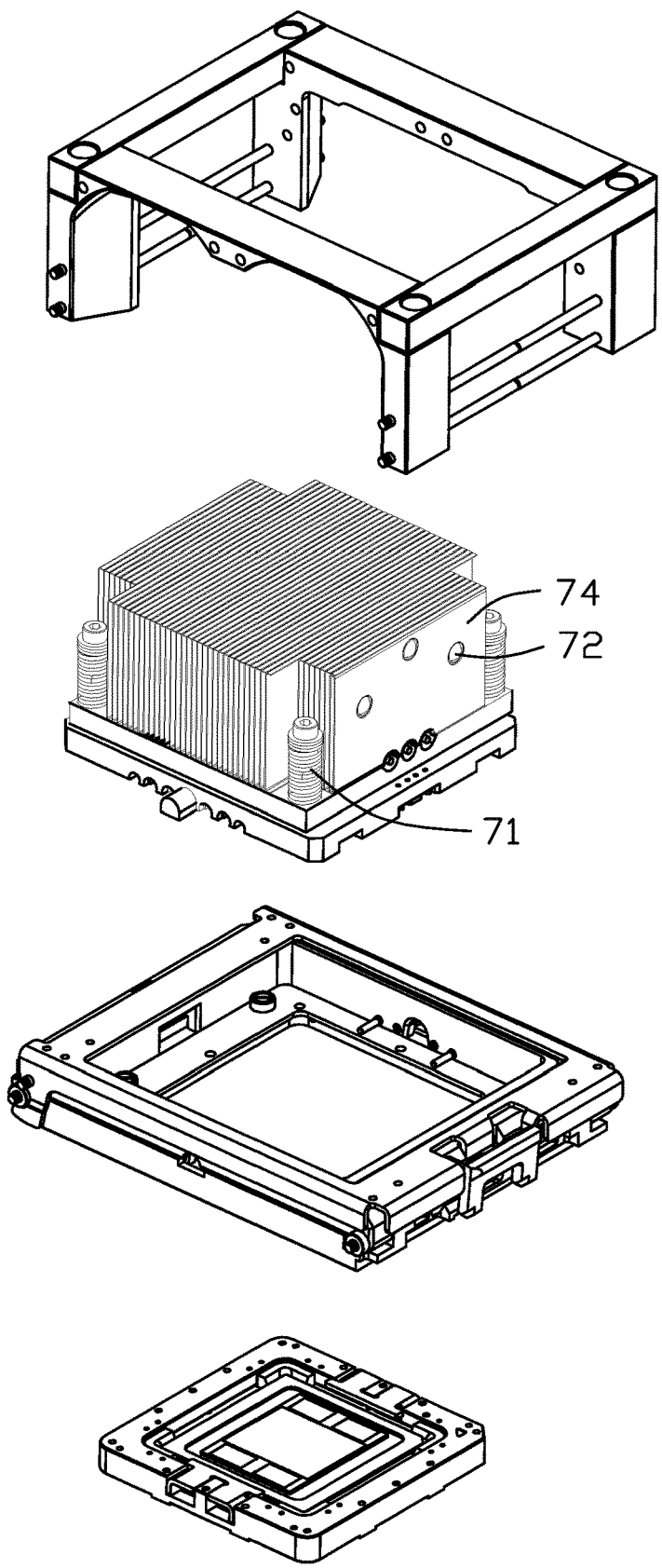
FIG. 9(A) is an exploded perspective view of the electrical connector assembly of FIG. 1 showing how the heat sink is assembled upon the heat dissipation part.
Figure 9B:
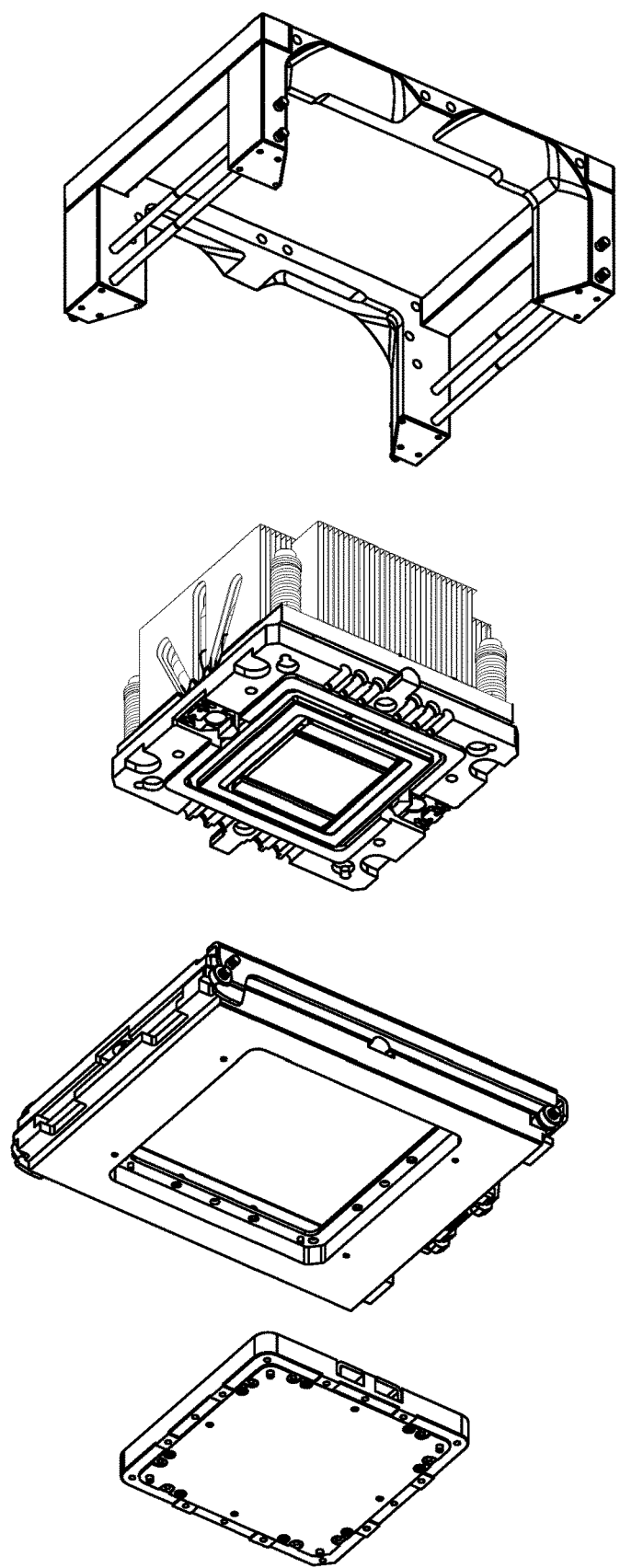
FIG. 9(B) is another exploded perspective view of the electrical connector assembly of FIG. 9(A)

The fan support 60 is of a rectangular frame secured to the second cover 40 and including a frame structure 62 and four supporting structures 64 at four corners. The frame structure 62 forms a guiding surface 620 and the screw holes 622. The supporting structure 64 forms a guiding surface 640 connecting to the guiding surface 620. The bottom of the supporting structure 64 has the hole 642. The screw 105 extends through the holes 49 of the second cover 40 and the holes 642 of the fan support 60 to assemble the fan support 60 and the second cover 40 together. Referring to FIG. 4, the fan 80 is assembled to the frame structure 622 by the screw 106 extending through the screw hole 622. Notably, the fan on one side blows out the air and the fan on the other side draws out the air so as to assure superior heat transfer.

Figure 10:
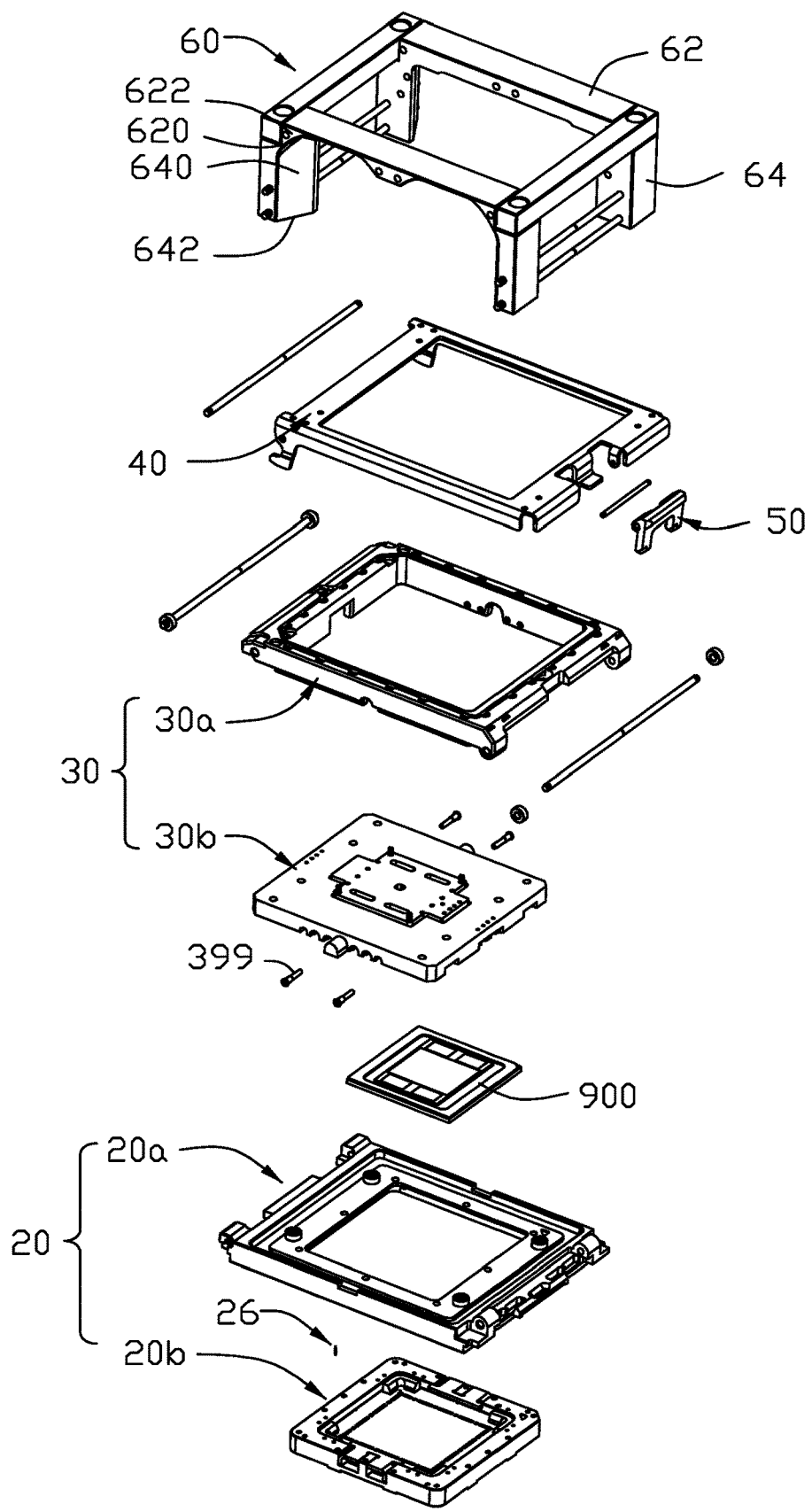
FIG. 10 is a further exploded perspective view of the electrical connector assembly of FIG. 2.

During assembling, the first cover 30 is assembled upon the housing 20 via the crossbar 102. The second cover 40 with the locker 50 pivotally assembled thereon, is assembled to the locking side 34 of the first cover 30 via the crossbar 103. In operation, both the first cover 30 and the second cover 40 are rotated to open positions to expose the receiving cavity 21 for loading the CPU 900 thereinto. Successively, both the first cover 30 and the second cover 40 are rotated to horizontal positions wherein the legs 47 are hooked to two opposite ends of the crossbar 101 and the hook 56 is engaged with the locking section 26 so as to have the whole electrical connector assembly in a locked state. The CPU 900 is mechanically and electrically connected to the contacts 26. After testing, by pressing the pressing section 52, the hook 56 of the locker 50 is released from the locking section 26. The second cover 40 is rotated to have the legs 47 unlocked from the ends of the crossbar 101. The first cover 30 is further lifted upward by rotation about the crossbar 102. The receiving cavity 21 is exposed upwardly to an exterior again for unloading the tested CPU 900 therefrom and loading a new CPU 900 for testing. In this invention, because two fans 80, of which one is blowing out the air and the other is drawing out the air, are respectively assembled upon the lateral sides of the fan support 60 and essentially located by two lateral sides of the heat sink 70 the transverse direction along which the slots formed between the fins 74 of the heat sink 70 extend, the heat can be efficiently removed from the heat sink 70. Understandably, most of the structures of the invention are similar to the traditional arrangement except the additional fan support and fans. FIG. 10 shows the further exploded perspective view of the related structures wherein the first cover 30 may include the outer frame 30a and the inner body 30b secured together by the screws 399, and the housing 20 may include an outer frame 20a and an inner body 20b. Notably, the features of the invention include provision of the fan support around the heat sink with a pair of fans, of which one is for blowing out the air and the other is for drawing out air, on two sides of the heat sink along the ventilation slots defined between the fins of the heat sink for superior heat dissipation. Understandably, in this embodiment the housing 20 is essentially wholly insulative. Anyhow, the metallic frame may be provided to surround the insulative housing to form the whole housing unit alternately. In this embodiment, the first cover and the second cover commonly form the cover sub-assembly which is essentially an intermediate structure not only for holding the heat sink upon the housing but also for supporting the fan support.

What is claimed is:

1. An electrical connector assembly comprising:
   a housing unit retaining a plurality of contacts and defining a receiving cavity for receiving an electronic package;
   a first cover pivotally assembled to one pivot side of the housing unit;
   a heat sink assembled to and extending above the first cover;
   a second cover pivotally assembled to one pivot side of the first cover;
   a fan support assembled upon the second cover; and
   at least one fan assembled upon the fan support; wherein
   the at least one fan comprises two fans in which one fan is located on one side of the fan support, and the other fan being located on another side of the fan support opposite the one side.

2. The electrical connector assembly as claimed in claim 1, wherein one fan of the two fans is an exhaust fan and the other fan of the two fans is an intake fan.

3. The electrical connector assembly as claimed in claim 2, wherein the two fans are opposite to each other in a direction along slots defined by fins of the heat sink.

4. The electrical connector assembly as claimed in claim 1, wherein the second cover is equipped with a pivotal locker releasably assembled to the housing unit.

5. The electrical connector assembly as claimed in claim 4, wherein the second cover forms hooks releasably locking to the housing unit.

6. The electrical connector assembly as claimed in claim 1, wherein the pivot side of the housing unit and the pivot side of the first cover are opposite to each other in a front-to-back direction while at least one fan of the two fans is located on a transverse side of the fan support in a transverse direction perpendicular to the front-to-back direction.

7. The electrical connector assembly as claimed in claim 1, wherein said fan support includes a frame structure and four supporting structures at four corners below the frame structure.

8. The electrical connector assembly as claimed in claim 7, wherein the fan support forms guiding surfaces along a transverse direction.

9. A method of testing an electronic package comprising steps of:
   providing a housing unit with a plurality of contacts and a receiving cavity therein;
   providing a first cover assembled to one pivot side of the housing unit in a pivotal manner;
   providing a second cover assembled to one pivot side of the first cover in another pivotal manner;
   providing a fan support assembled upon the second cover;
   attaching at least one fan on the fan support; and
   loading an electronic package into the receiving cavity;
   wherein when assembled, the first cover and the second cover are stacked with each other in a vertical direction; wherein
   the pivot side of the housing unit and the pivot side of the first cover are opposite to each other in a front-to-back direction perpendicular to the vertical direction while the at one fan is located on one transverse side in a transverse direction perpendicular to both vertical direction and the front-to-back direction; wherein
   the at least one fan includes two fans respectively assembled on two opposite transverse sides of the fan support in the transverse direction.

10. The method as claimed in claim 9, wherein said fan support includes a frame structure at a top and four supporting structures at four corners below the frame structure.

11. The method as claimed in claim 9, wherein a heat sink is enclosed within the fan support and abuts against a bearing section in the first cover.

12. The method as claimed in claim 11, wherein said heat sink is secured to the bearing section.

13. An electrical connector assembly comprising:
a housing unit retaining a plurality of contacts and defining a receiving cavity for receiving an electronic package;
a cover sub-assembly attached to the housing unit;
a fan support discrete from but assembled upon the cover sub-assembly;
a heat sink associated with the cover sub-assembly and enclosed within the fan support; and
at least one fan assembled upon the fan support; wherein
said fan support includes a frame structure at a top and four supporting structures at four corners below said frame structure in a vertical direction; wherein
the at least one fan comprises two fans in which one fan is located on one side of the fan support, and the other fan being located on another side of the fan support opposite the one side.

14. The electrical connector assembly as claimed in claim 13, wherein at least one of the two fans is secured to a transverse side of the fan support in a transverse direction along slots defined by fins of the heat sink, said transverse direction being perpendicular to the vertical direction.

15. The electrical connector assembly as claimed in claim 14, wherein the heat sink is secured to a bearing section of the cover sub-assembly.

16. The electrical connector assembly as claimed in claim 15, wherein said cover sub-assembly includes a first cover pivotally assembled to the housing unit, and a second cover pivotally assembled to the first cover.

17. The electrical connector assembly as claimed in claim 16, wherein the first cover is assembled to one pivot side of the housing unit, and the second cover is assembled to another pivot side of the first cover opposite to said pivot side of the housing unit in a front-to-back direction perpendicular to both the front-to-back direction and the transverse direction.

18. The electrical connector assembly as claimed in claim 13, wherein at least one of the two fans is located lower than the frame structure of the fan support in the vertical direction.

19. The electrical connector assembly as claimed in claim 13, wherein in a top view along the vertical direction, a dimension of the frame structure is close to that of the cover sub-assembly.

* * * * *